(12) United States Patent
Cracraft

(10) Patent No.: US 9,996,640 B2
(45) Date of Patent: *Jun. 12, 2018

(54) ACCELERATING PARTICLE-SWARM ALGORITHMS

(71) Applicant: International Business Machines Corporation, Armonk, NY (US)

(72) Inventor: Michael A. Cracraft, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 434 days.

This patent is subject to a terminal disclaimer.

(21) Appl. No.: 14/724,379

(22) Filed: May 28, 2015

(65) Prior Publication Data

US 2016/0125103 A1  May 5, 2016

Related U.S. Application Data

(63) Continuation of application No. 14/529,988, filed on Oct. 31, 2014.

(51) Int. Cl.
G06F 17/10 (2006.01)
G06F 17/50 (2006.01)
G06N 3/00 (2006.01)

(52) U.S. Cl.
CPC ......... *G06F 17/5009* (2013.01); *G06N 3/006* (2013.01)

(58) Field of Classification Search
CPC .................................... G06F 17/5018
USPC .......................................... 703/2
See application file for complete search history.

(56) References Cited

U.S. PATENT DOCUMENTS

| 8,238,924 B2 * | 8/2012 | Eberhart | G06N 3/126 455/418 |
| 8,645,294 B1 * | 2/2014 | Owechko | G06N 5/043 706/14 |
| 2014/0172125 A1 * | 6/2014 | Shokooh | G05B 13/04 700/29 |

OTHER PUBLICATIONS

Gardner, et al., "A Speculative Approach to Parallelization in Particle Swarm Optimization", 2012, 2 pages.
Gardner, et al., "Speculative Evaluation in Particle Swarm Optimization", Department of Computer Science, Brigham Young University, Sep. 11, 2010, pp. 61-70.
Venter, et al., "A Parallel Particle Swarm Optimization Algorithm Accelerated by Asynchronous Evaluations", 6th World Congresses of Structural and Multidisciplinary Optimization, May 30-Jun. 2005, 10 pages.

(Continued)

*Primary Examiner* — Andy Ho
(74) *Attorney, Agent, or Firm* — DeLizio Law, PLLC

(57) ABSTRACT

Embodiments of the inventive subject matter include determining a plurality of potential full resolution locations for a particle representation for a second iteration of a particle swarm optimization, wherein the particle representation is associated with both a first full resolution location and a first reduced resolution location for a first iteration of the particle swarm optimization that has not yet completed and the second iteration is later than the first iteration. Embodiments further include determining that the plurality of full resolution locations reduces to a second reduced resolution location for the second iteration. Embodiments further include submitting the second reduced resolution location for fitness calculation prior to the first iteration completing.

9 Claims, 6 Drawing Sheets

(56) References Cited

OTHER PUBLICATIONS

Yang, et al., "Accelerated Particle Swarm Optimization and Support Vector Machine for Business Optimization and Applications", Mar. 29, 2012, 12 pages.
"U.S. Appl. No. 14/529,988 FAI Office Action", dated Dec. 13, 2017, 3 pages.
"U.S. Appl. No. 14/529,988 First Action Interview—Pre Interview", dated Jul. 13, 2017, 5 pages.

* cited by examiner

ACCELERATING PARTICLE-SWARM ALGORITHMS

RELATED APPLICATIONS

This application is a Continuation of and claims the priority benefit of U.S. application Ser. No. 14/529,988 filed Oct. 31, 2015.

BACKGROUND

Embodiments of the inventive subject matter generally relate to the field of computing, and more particularly, to particle swarm optimization.

Particle swarm optimization is a metaheuristic optimization that attempts to find the most optimal solution to a problem. Particle swarm optimization algorithms search a solution space with "particles." During each iteration of a particle swarm optimization algorithm, the particles move to new locations in the solution space. Each location corresponds to a candidate solution to the problem. Once the location of each particle has been determined at a current iteration, the fitness of each location is calculated using a fitness function. After the fitness of each location is calculated at the current iteration, a next iteration of the particle swarm optimization algorithm begins and the particles move to new locations in the solution space. The process continues until a termination criterion is satisfied.

Typically, a particle's location during the next iteration is dictated by the most fit location that the particle has occupied (the particle's "personal best"), the most fit location that any of the particles in the swarm has occupied (the "global best"), and the particle's momentum. Because each particle moves about the solution space based on its personal best and the global best, each particle tends to move toward the most fit location. Additionally, because each particle moves about the solution space based on its personal best and the global best, the movement of each particle about the solution space is dependent on the fitness calculations performed during all previous iterations. Consequently, locations of particles at the next iteration cannot be determined until the fitness of each particle at the current iteration has been calculated.

SUMMARY

Embodiments of the inventive subject matter include determining a plurality of potential full resolution locations for a particle representation for a second iteration of a particle swarm optimization, wherein the particle representation is associated with both a first full resolution location and a first reduced resolution location for a first iteration of the particle swarm optimization that has not yet completed and the second iteration is later than the first iteration. Embodiments further include determining that the plurality of full resolution locations reduces to a second reduced resolution location for the second iteration. Embodiments further include submitting the second reduced resolution location for fitness calculation prior to the first iteration completing.

BRIEF DESCRIPTION OF THE DRAWINGS

The embodiments may be better understood by referencing the accompanying drawings.

DESCRIPTION OF EMBODIMENT(S)

Figure 1:
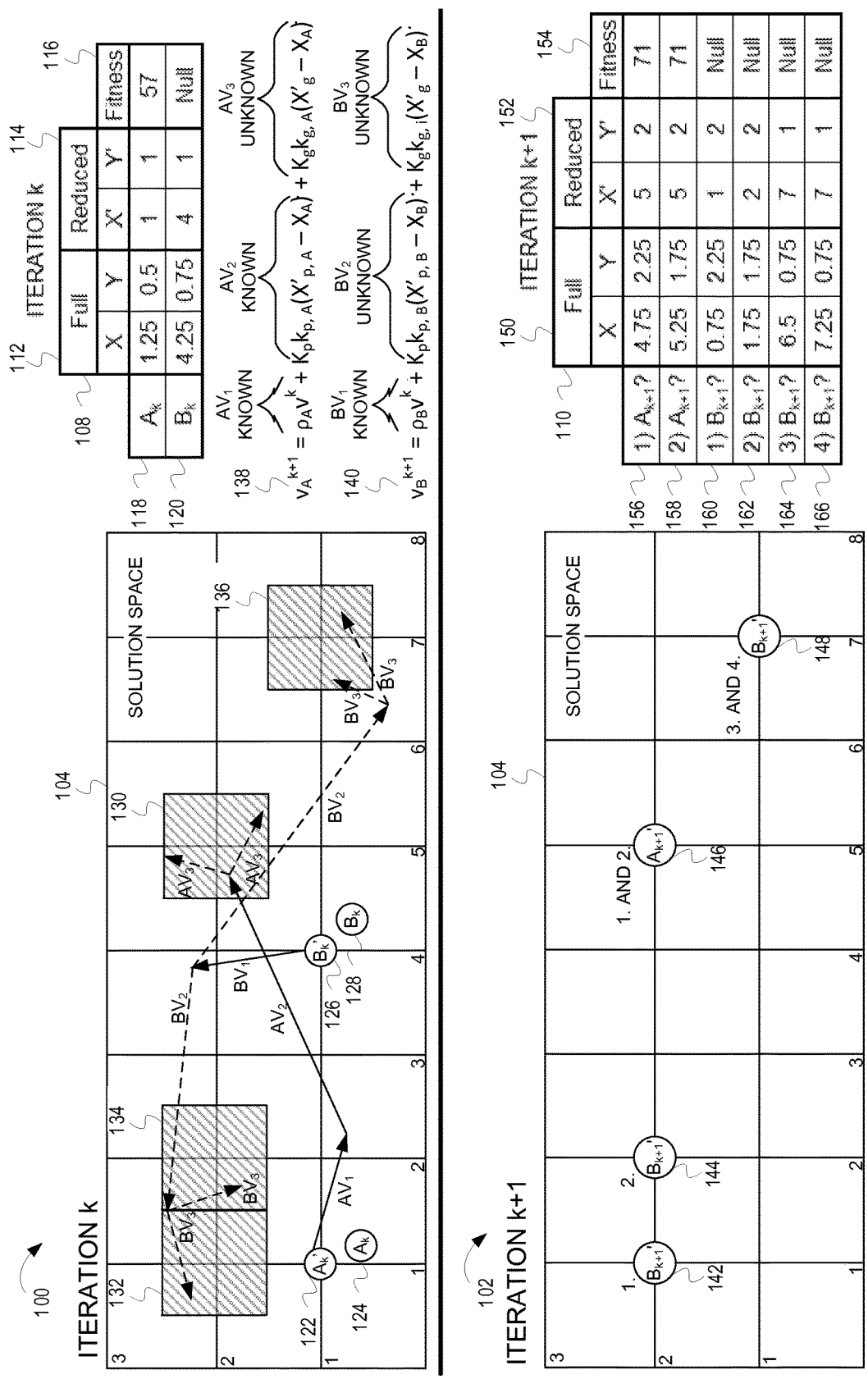
FIG. 1 depicts a conceptual example of an accelerated particle swarm optimization.

The description that follows includes example systems, methods, techniques, instruction sequences and computer program products that embody techniques of the inventive subject matter. However, it is understood that the described embodiments may be practiced without these specific details. For instance, although examples refer to particles existing in two-dimensional space (i.e., each particle has two coordinates) the scope of the claims are not so limited. Embodiments can search an n-dimensional space (i.e., each particle has n coordinates) with n being any integer greater than 0. In other instances, well-known instruction instances, protocols, structures and techniques have not been shown in detail in order not to obfuscate the description.

Introduction

Typically, particle swarm optimization algorithms utilize two equations, $$\vec{v}_i^{k+1} = \rho_i \vec{v}_i^k + K_p k_{p,i}(\vec{x}_{p,i}^k - \vec{x}_i^k) + K_g k_{g,i}(\vec{x}_g^k - \vec{x}_i^k) \qquad 1:$$

$$\vec{x}_i^{k+1} = \vec{x}_i^k + \vec{v}_i^{k+1} \qquad 2:$$

where the superscript k denotes the current iteration; the subscript "i" identifies the particle; the superscript k+1 denotes the next iteration; $\vec{v}_i^{k+1}$ represents a particle's velocity for the k+1 iteration; $\rho_i \vec{v}_i^k$ represents a particles "momentum" for the k iteration; $\vec{x}_{p,i}^k$ represents the particle's personal best; $\vec{x}_i^k$ represents the particle's current location for the k iteration; and $\vec{x}_g^k$ represents the global best as of the k iteration. The expression $(\vec{x}_{p,i}^k - \vec{x}_i^k)$ represents a particle's affinity to its personal best. The expression $(\vec{x}_g^k - \vec{x}_i^k)$ represents a particle's affinity to a global best. The terms $K_p$ and $K_{p,i}$ are constants controlling a particle's affinity to the particle's personal best, and the terms $K_g$ and $k_{g,i}$ are constants controlling a particle's affinity to the global best. Particle swarm optimization algorithms typically initialize by placing the particles at random locations within the solution space. The fitness of each of the random locations is then calculated. Each particle's personal best and a best for all of the particles (i.e., the "global best") are determined based on these calculations. Once the calculations are complete, the next iteration of the particle swarm optimization algorithm can begin. To calculate the fitness of each of the locations of the particles during the next iteration, the locations of the particles at the next iteration are first determined.

Locations of each of the particles at the next iteration are determined using the two equations above. The first equation calculates a particle's velocity ($\vec{v}_i^{k+1}$) based on the particle's momentum ($\rho_i \vec{v}_i^k$), the particle's personal best relative to the particle's current location ($\vec{x}_{p,i}^k - \vec{x}_i^k$), and the current global best relative to the particle's current location ($\vec{x}_{g,i}^k - \vec{x}_i^k$). The second equation determines the particle's location ($\vec{x}_i^{k+1}$) based on the particle's velocity ($\vec{v}_i^{k+1}$) and the particle's current location ($\vec{x}_i^k$). Once the location for each particle at the next iteration is known, the fitness of each of the locations of the particles is again calculated. The locations for each particle at the next iteration may result in new personal bests and/or a new global best. This process continues until a termination criterion is satisfied. Examples of a termination criterion include completion of a specified number of iterations and a candidate solution falling within a defined range.

Numerous iterations may be run before a termination criterion is satisfied, but the iterations have sequential dependencies. As described above, the location of a particle in iteration k+1 is calculated with the velocity in iteration k+1 and the location in iteration k. The velocity in iteration k+1 is calculated with the global best of iteration k. Since the global best is not known until the end of an iteration, the particles of iteration k cannot proceed to a location in iteration k+1 until the end of iteration k even though the other values (e.g., location in iteration k and momentum) for computing the iteration k+1 velocity are known before the end of iteration k.

Overview

Particle swarm optimization can be accelerated by reducing resolution of particles' locations. Reducing resolution of a location can be rounding values, eliminating insignificant figures, reducing mathematical precision, etc. For example, all particle location values between 1.5 and 2.49 will reduce in resolution to a value of 2 (i.e., all values between 1.5 and 2.49 round to the integer value 2). Reducing resolution of particles' locations in iteration k reduces the number of potential particle locations in iteration k+1. For example, although there may be two potential full resolution locations for a particle at iteration k+1, the two potential full resolution locations for the particle at iteration k+1 may reduce to the same reduced resolution location. If the two potential full resolution locations for the particle at iteration k+1 reduce to the same reduced resolution location, the reduced resolution location for the particle at iteration k+1 is known. Because the reduced resolution location for the particle at iteration k+1 is known, the fitness of the reduced resolution location for the particle at iteration k+1 can be calculated, thus allowing the particle swarm optimization to be accelerated.

FIG. 1 depicts a conceptual example of an accelerated particle swarm optimization. The top portion 100 of FIG. 1 depicts a solution space 104 at iteration k, a first table 108 including values for particles at iteration k, and two velocity equations 138 and 140 for particles at iteration k. The bottom portion 102 of FIG. 1 depicts the solution space 104 at iteration k+1 and a second table 110 including values for particles at iteration k+1. This discussion will begin with the top portion 100 of FIG. 1.

At iteration k, the solution space 104 includes two particles, A and B. The full resolution location of particle A at iteration k is represented by circle 124 and denoted by the text "$A_k$." As depicted in the solution space 104, the full resolution location of particle A at iteration k is (1.25, 0.5). The reduced resolution location of particle A at iteration k is represented by circle 122 and denoted by the text "$A_k'$." As depicted in the solution space 104, the reduced resolution location of particle A at iteration k is (1, 1). Circles 124 and 122 (associated with particle A) have solid boundary lines because the fitness of the location of particle A has already been calculated at iteration k. The full resolution location of particle B at iteration k is represented by circle 128 and denoted by the text "$B_k$." As depicted in the solution space 104, the full resolution location of particle B at iteration k is (4.25, 0.75). The reduced resolution location of particle B at iteration k is represented by circle 126 and denoted by the text "$B_k'$." As depicted in the solution space 104, the reduced resolution location of particle B at iteration k is (4, 1).

In the example accelerated particle swarm optimization depicted in FIG. 1, the operation for reducing the resolution of particle locations is rounding. The first table 108 includes values associated with particles A and B at iteration k. The first table 108 includes three columns—a full resolution location column 112, a reduced resolution location column 114, and a fitness column 116. The first table 108 includes two rows—a first row 118 associated with particle A at iteration k and a second row 120 associated with particle B at iteration k. The full resolution location column 112 indicates the X and Y coordinates of the full resolution locations of particles A and B at iteration k, the reduced resolution column 114 indicates the X and Y coordinates of the reduced resolution locations of particles A and B at iteration k, and the fitness column 116 includes the calculated fitness for particles A and B at iteration k. The fitness column 116 includes a calculated fitness for particle A because the fitness of the location of particle A at iteration k has been calculated. The fitness of the reduced resolution location of particle A at iteration k is 57. Because the fitness of the location of particle A at iteration k has been calculated, particle A's personal best is known at iteration k. The fitness column 116 does not include a calculated fitness for particle B at iteration k because the fitness of the location of particle B at iteration k has not yet been calculated. Because the fitness of the location of particle B at iteration k has not yet been calculated, the personal best for particle B at iteration k is not known. Rather, there exist two potential personal bests for particle B at iteration k. The first potential personal best for particle B at iteration k is the personal best for particle B at iteration k−1 (the previous iteration). The second potential personal best for particle B at iteration k is the location of particle B at iteration k. Put simply, until the fitness of the location of particle B at iteration k is calculated, it is not known whether the location of particle B at iteration k is more fit than the personal best for particle B at iteration k−1.

The equation $\vec{v}_i^{k+1} = \rho_i \vec{v}_i^k + K_p k_{p,i} (\vec{x}_{p,i}^k - \vec{x}_i^k) + K_g k_{g,i} (\vec{x}_g^k - \vec{x}_i^k)$ is used to determine the velocity of each particle. The velocity of each particle is used, in concert with each particle's current location, to determine the location of each particle at the next iteration. As previously discussed, the velocity equation includes three terms. The first term ($\rho_i \vec{v}_i^k$) is based on a particle's momentum; the second term ($\vec{x}_{p,i}^k - \vec{x}_i^k$) is based on the particle's affinity to the particle's personal best; and the third term ($\vec{x}_g^k - \vec{x}_i^k$) is based on the particle's affinity to the global best. The two equations 138 and 140 are broken down based on these three terms, where $iV_1$ (i indicates the particle) represents the first term based on the particle's momentum; $iV_2$ represents the second term based on the particle's personal best; and $iV_3$ represents the third term based on the global best. The first term ($iV_1$) is not dependent on fitness calculations performed. The second and third terms ($iV_2$ and $iV_3$, respectively) are dependent on fitness calculations performed. Specifically, the second term ($iV_2$) is dependent on fitness calculations performed for the particle (i.e., the particle's personal best) and the second term ($iV_3$) is dependent on fitness calculations performed for the swarm (i.e., the global best).

The first equation 138 is associated with particle A. At iteration k for particle A, the first term ($AV_1$) and the second term ($AV_2$) are known, but the third term ($AV_3$) is not known. The second term ($AV_2$) is known because the fitness of the location of particle A at iteration k has been calculated (i.e., the personal best for particle A at iteration k is known). The solution space 104 includes vectors represented as solid lines that are associated with known terms $AV_1$ and $AV_2$. The third term ($AV_3$) is not known because the fitness of the location of particle B at iteration k is not known (i.e., the global best for the swarm at iteration k is not known). Although the global best at iteration k is not known, there exist only two potential global bests at iteration k. The first potential global best is the global best for the swarm at iteration k−1 (assuming that the fitness of the global best for the swarm at iteration k−1 is greater than 57). The second potential global best for the swarm is the location of particle B at iteration k. Because there are two potential global bests, the solution space includes two vectors represented by hashed lines that are associated with the unknown term $AV_3$. Each of the two $AV_3$ hashed lines is associated with one of the potential global bests. For example, if the global best at iteration k is the global best for the swarm at iteration k−1, the upper $AV_3$ hashed line indicates the full resolution location of particle A at iteration k+1. If the global best at iteration k is the location of particle B at iteration k, the lower $AV_3$ hashed line indicates the full resolution location of particle A at iteration k+1. However, whether the upper $AV_3$ hashed line or the lower $AV_3$ hashed line indicates the full resolution location of particle A at iteration k+1, the reduced resolution location of particle A at iteration k+1 will be the same. Put simply, the influence of the term $AV_3$ is such that no matter which of the two potential global bests is determined to be the global best for iteration k, the reduced resolution location of particle A at iteration k+1 will be the same. The second table 110 includes the two potential full resolution locations for particle A at iteration k+1 that are associated with the upper and lower $AV_3$ hashed lines. The two potential full resolution locations for particle A at iteration k+1 are (4.75, 2.25) and (5.25, 1.75), as shown by rows 156 and 158 of the second table 110. Based on the rounding operation used in this example, both of the potential full resolution locations of particle A at iteration k+1 reduce to the same reduced resolution location (5, 2). This is shown in solution space 104 as both the upper and lower $AV_3$ hashed lines indicate full resolution locations that fall within box 130. In this example, box 130 has vertices (4.5, 1.5), (5.49, 1.5), (5.49, 2.49), and (4.5, 2.49). Based on the rounding operation used in this example, any point that falls within box 130 will have a reduced resolution location of (5, 2). Consequently, regardless of which of the two potential global bests is the global best for iteration k, the reduced resolution location of particle A at iteration k+1 is (5, 2). Because there is only one reduced resolution location for particle A at iteration k+1, the reduced resolution location for particle A at iteration k+1 is known. The reduced resolution location of particle A at iteration k+1 is represented by circle 146 in the solution space 104 in the lower portion 102 of FIG. 1 and is denoted by the text "$A_{k+1}$'."
Because the reduced resolution location of particle A at iteration k+1 is known, the fitness of the reduced resolution of particle A at iteration k+1 can be calculated. As shown in column 154 of the first table 110, the fitness of the reduced resolution location for particle A at iteration k+1 is 71.

The second equation 140 is associated with particle B. At iteration k for particle B, the first term ($BV_1$) is known but the second term ($BV_2$) and third term ($BV_3$) are not known. The second term ($BV_2$) is not known because the personal best for particle B at iteration k is not known. The third term ($BV_3$) is not known because the global best for the swarm at iteration k is not known. As with the lines associated with the vectors for particle A, the lines associated with the vectors for particle B are solid if the term represented by the vector is known and hashed if the term represented by the vector is unknown. Consequently, the line associated with the $BV_1$ vector is solid and the lines associated with both the $BV_2$ and $BV_3$ vectors are hashed. Based on the vectors associated with particle B at iteration k, there are four potential full resolution locations for particle B at iteration k+1 and three potential reduced resolution locations for particle B at iteration k+1. The first two potential full resolution locations for particle B at iteration k+1 are (0.75, 2.25) and (1.75, 1.75), as indicated in rows 160 and 162 of the second table 110, and fall within boxes 132 and 134, respectively. All full resolution locations within box 132 have a reduced resolution location of (1, 2), and all full resolution locations within box 134 have a reduced resolution location of (2, 2). Consequently, the first two reduced resolution locations for particle B at iteration k+1 are (1, 2) and (2, 2). The second two potential full resolution locations for particle B at iteration k+1 are (6.5, 0.75) and (7.25, 0.75), as indicated by rows 164 and 166 of the second table 110, and fall within box 136. All full resolution locations within box 136 have a reduced resolution location of (7, 1). Consequently, there are three potential reduced resolution locations for particle B at iteration k+1. The three potential reduced resolution locations for particle B at iteration k+1 are (1, 2), (2, 2), and (7, 1), as indicated by rows 160, 162, 164, and 166 of the second table 110. The first potential reduced resolution location for particle B at iteration k+1 (i.e., the first "$B_{k+1}$'?") is represented by circle 142 in the solution space 104 of the lower portion 102 of FIG. 1 and denoted by the text "$B_{k+1}$'." The second potential reduced resolution location for particle B at iteration k+1 (i.e., the second "$B_{k+1}$'?") is represented by circle 144 in the solution space 104 of the lower portion 102 of FIG. 1 and denoted by the text "$B_{k+1}$'." The third potential reduced resolution location for particle B at iteration k+1 (i.e., the third and fourth "$B_{k+1}$'?") is represented by circle 148 in the solution space 104 of the lower portion 102 of FIG. 1 and denoted by the text "$B_{k+1}$'." The fitness of each of the potential reduced resolution locations of particle B at iteration k+1 has not been calculated, as indicated by the "null" values in column 154 of the second table 110. The fitness of each of the potential reduced resolution locations for particle B have not been calculated because the actual reduced resolution location of particle B at iteration k+1 is not known (i.e., there are three potential reduced resolution locations for particle B at iteration k+1). It should be noted that although the fitness of each of the potential reduced resolution locations for particle B at iteration k+1 have not been calculated, in some embodiments, the fitness of potential reduced resolution locations can be calculated (see discussion of FIG. 5).

Although the fitness of the locations of all of the particles in the swarm (i.e., particle A and particle B) at iteration k have not been calculated, embodiments of the inventive subject matter allow determination of locations of at least some of the particles at the next iteration (iteration k+1). As can be seen in FIG. 1, the reduced resolution location of particle A at iteration k+1 can be determined even though the global best for the swarm at iteration k is not yet known. Because of this resolution reduction, the example particle swarm optimization is accelerated and fitness calculations can begin for iteration k+1 before iteration k completes.

Figure 2:
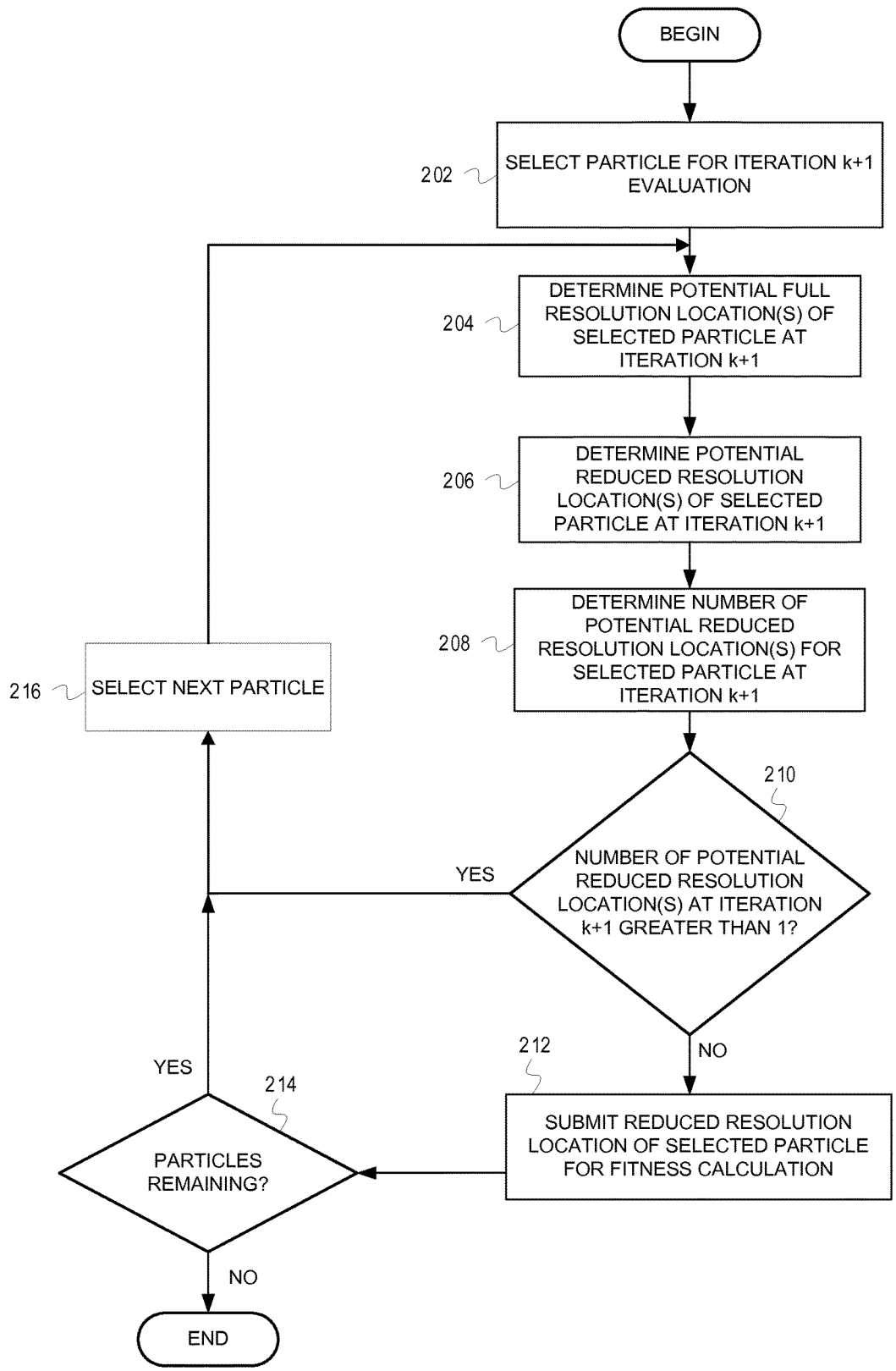
FIG. 2 is a flow diagram depicting example operations for accelerating a particle swarm optimization.

FIG. 2 is a flow diagram depicting example operations for accelerating a particle swarm optimization. The flow begins at block 202. The acceleration of particle swarm into iteration k+1 occurs while iteration k of the particle swarm optimization is still running. For instance, while a first thread performs operations for particle swarm optimization in an iteration k, a second thread can be triggered to accelerate into iteration k+1. The second thread begins operations for the particles' reduced resolution locations at the current iteration (i.e., iteration k) and determines whether a single reduced resolution location can be determined for any of the particles at the next iteration (i.e., iteration k+1).

At block 202, a particle in a particle swarm optimization is selected for iteration k+1 evaluation. When the second thread is invoked (i.e., when the acceleration begins) a particle is selected from the particle swarm. The flow continues at block 204.

At block 204, the potential full resolution location(s) for the selected particle at iteration k+1 are determined. As previously mentioned, locations of particles at iteration k+1 are determined based on three vectors—a first vector based on the particle's momentum, a second vector based on the particle's personal best, and a third vector based on the global best. If the fitness of the locations of each of the particles at iteration k has been calculated, all three vectors are known and the full resolution location of the selected particle (as well as the reduced resolution location of the selected particle) at iteration k+1 is known. If the fitness of the location of the selected particle at iteration k has been calculated but the fitness of the locations of other particles at iteration k have not been calculated, only the first two vectors are known (e.g., see particle A in FIG. 1) and there may exist multiple potential full resolution locations for the selected particle at iteration k+1. If the fitness of the location of the selected particle at iteration k has not been calculated, only the first vector is known (e.g., see particle B in FIG. 1) and there may exist multiple potential full resolution locations for the selected particle at iteration k+1. The flow continues at block 206.

At block 206, the potential reduced resolution location(s) for the selected particle at iteration k+1 are determined based on the determined full resolution locations. The reduced resolution location(s) for the selected particle are based on resolution reduction of the full resolution location(s) of the selected particle determined at block 204. As previously discussed, the resolution of particle locations can be reduced by rounding values, eliminating insignificant figures, reducing mathematical precision, etc. In some embodiments, the resolution reduction is dependent on the granularity of real world materials. For example, a particle swarm optimization can be used to determine the optimal resistance of a resistor, inductance of an inductor, and length of a connecting wire in a computer chip. While a solution space may include values with a higher degree of resolution (e.g., precision to the one hundred thousandths place or greater), the granularity of the materials may require a range of finite values. For example, the possible resistances for a resistor may be in 1Ω increments; the possible inductances of an inductor may be in 0.5 mH increments; and the possible connecting wire lengths may be in 0.25 mm increments. In such an embodiment, the resolution of a particle's location can be reduced to match these increments (e.g., a resistance value of 3.6Ω would reduce to 4Ω, an inductance of 3.3 mH would reduce to 3.5 mH, and a wire length of 1.11 mm would reduce to 1.0 mm). The flow continues at block 208.

At block 208, the number of potential reduced resolution locations for the selected particle at iteration k+1 is determined. As discussed above, the number of potential full resolution locations for each particle at iteration k+1 depends on whether the fitness of the reduced resolution locations of all particles in the swarm at iteration k have been calculated. However, even though there may exist more than one potential full resolution location for the selected particle at iteration k+1, the multiple potential full resolution locations for the selected particle at iteration k+1 may reduce in resolution to only one potential reduced resolution location for the selected particle at iteration k+1 (e.g., see particle A in FIG. 1). In such a case, the reduced resolution location of the selected particle at iteration k+1 is known. The flow continues at decision diamond 210.

At decision diamond 210, if the number of potential reduced resolution location(s) of the selected particle at iteration k+1 is greater than one (i.e., the reduced resolution location of the selected particle at iteration k+1 is not known), the flow continues at block 216 where the next particle in the particle swarm optimization is selected. If there is only one potential reduced resolution location for the selected particle at iteration k+1 (i.e., the reduced resolution location of the selected particle at iteration k+1 is known), the flow continues at block 212.

At block 212, the reduced resolution location of the selected particle at iteration k+1 is submitted for fitness calculation. For example, the reduced resolution location of the selected particle at iteration k+1 is added to a fitness calculation queue. Because the reduced resolution location of the selected particle at iteration k+1 is known, calculating the fitness of the reduced resolution location of the selected particle at iteration k+1 efficiently uses resources (i.e., because the reduced resolution location of the selected particle at iteration k+1 is known, no superfluous calculation are performed). The flow continues at decision diamond 214.

At decision diamond 214, if there are particles remaining (i.e., if the example operations for accelerating a particle swarm optimization have not been completed for each particle in the particle swarm optimization), the flow continues at block 216 where the next particle is selected. If there are no particles remaining (i.e., if the example operations for accelerating a particle swarm optimization have been completed for each particle in the particle swarm optimization), the flow ends.

Figure 3:
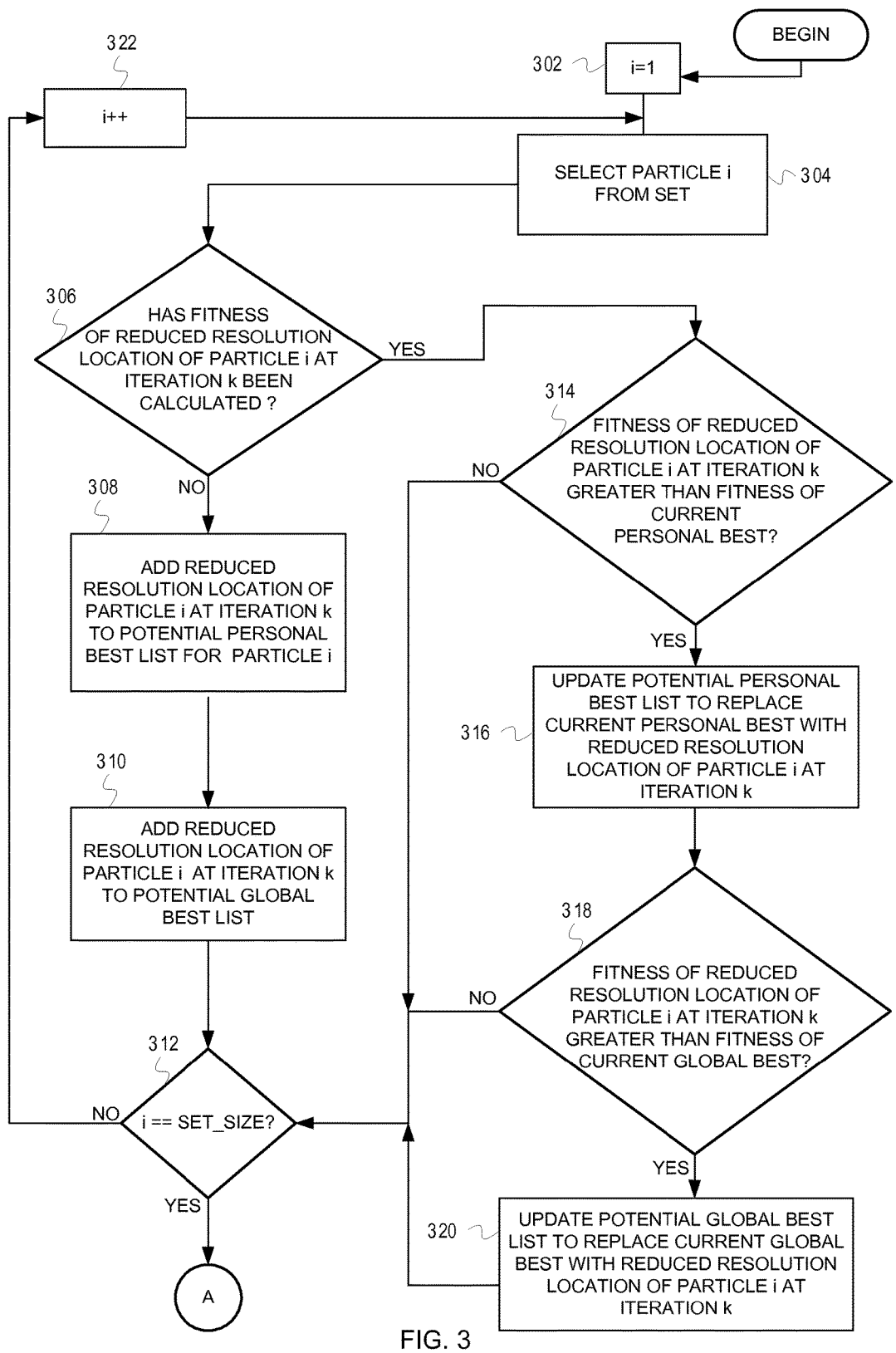
FIG. 3 is a flow diagram depicting example operations for updating potential personal best lists for each particle in a set and a potential global best list for the set to aid in accelerating a particle swarm optimization.
Figure 4:
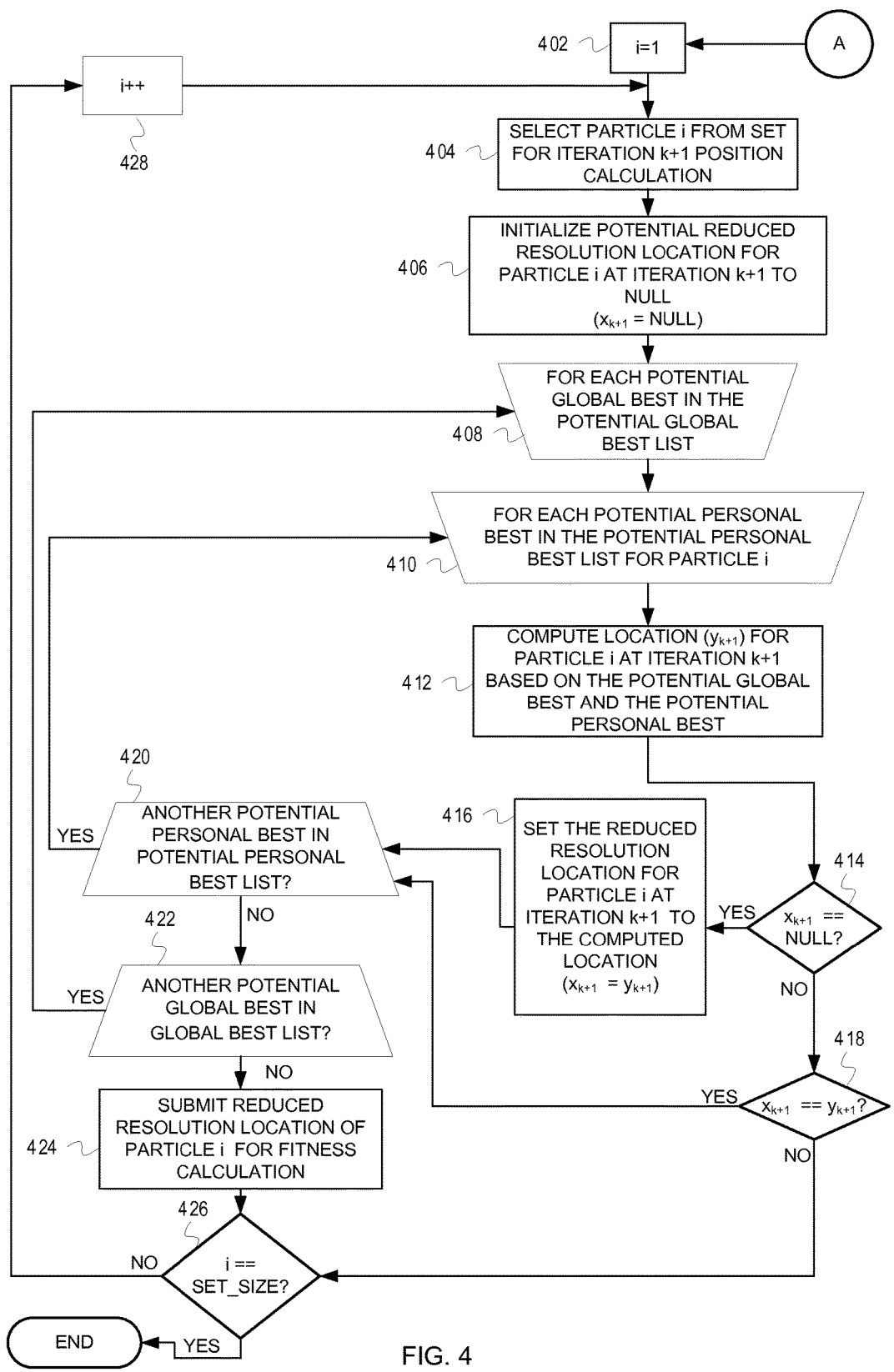
FIG. 4 is a flow diagram depicting example operations for using the lists updated in FIG. 3 to calculate potential reduced resolution locations for the particles in the set at iteration k+1.

FIG. 3 is a flow diagram depicting example operations for updating potential personal best lists for each particle in a set and a potential global best list for the particles in the set to aid in accelerating a particle swarm optimization. A particle set can be all of the particles in a swarm, or can be a sub-swarm, containing fewer than all of the particles in the swarm. In some embodiments, as depicted by the operations of FIG. 3, a second thread begins operations for the particles in the set to create and update a potential personal best list for each particle while a first thread performs operations for particle swarm optimization in an iteration k. Each potential personal best list includes all potential personal bests for a corresponding particle at iteration k, based on the progress that the first thread has made in the particle swarm optimization. Additionally the second thread performs operations for the particles in the set to create and update a potential global best list for the set. The potential global best list includes all potential global bests for the set at iteration k, based on the progress that the first thread has made in the particle swarm optimization. In some embodiments, the second thread will not begin performing the operations of FIG. 3 until a specified number (e.g., percentage) of particles have been evaluated by the first thread. For example, the second thread may not begin the operations of FIG. 3 until the first thread has evaluated 50% of the particles at iteration k. After the operations of FIG. 3 have been completed for all particles in the set, the flow continues to FIG. 4. FIG. 4 is a flow diagram depicting example operations for using the lists updated in FIG. 3 to calculate potential reduced resolution locations for the particles of the set at iteration k+1, and if appropriate, submitting the potential reduced resolution locations for the particles of the set at iteration k+1 for fitness evaluation. The operations of FIG. 3 begin at block 302.

At block 302, an i value is initialized to equal one. The i value is initialized to one so that the first particle in the set is selected. As the second thread performs the operations of FIG. 3 for the particles, the i value is incremented so that the operations of FIG. 3 should be performed for all particles in the set. The flow continues at block 304.

At block 304, particle i is selected from the set. For example, when the i value is initialized to one, the first particle in the set is selected. After the operations of FIG. 3 have been completed once, the i value is incremented to two and the second particle in the set is selected, and so on and so forth. The flow continues at decision diamond 306.

At decision diamond 306, it is determined whether the fitness of the reduced resolution location of particle i at iteration k has been calculated. If the fitness of the reduced resolution location of particle i at iteration k has been calculated, the flow continues at decision diamond 314. If the fitness of the reduced resolution location of particle i at iteration k has not been calculated, the flow continues at block 308.

At block 308, the reduced resolution location of particle i at iteration k is added to a potential personal best list for particle i. Because the fitness of the reduced resolution location of particle i at iteration k has not been calculated, it is unknown whether the fitness of the reduced resolution location of particle i at iteration k is greater than the fitness of the personal best for particle i at the previous iteration (i.e., iteration k−1). Because it is not known whether the fitness of the reduced resolution location of particle i at iteration k is greater than the fitness of the personal best for particle i at iteration k−1, there exist two potential personal bests for particle i at iteration k−1 (i.e., the reduced resolution location of particle i at iteration k and the personal best for particle i at iteration k−1). Consequently, the potential personal best list for particle i at iteration k includes two entries, the reduced resolution location of particle i at iteration k and the personal best for particle i at iteration k−1. The flow continues at block 310.

At block 310, the reduced resolution location of particle i at iteration k is added to the potential global best list for the swarm. Because the fitness of the reduced resolution location of particle i at iteration k has not been calculated, it is unknown whether the fitness of the reduced resolution location of particle i at iteration k is greater than the fitness of any other reduced resolution locations in the potential global best list. Consequently, after completion of the operations of FIG. 3, the potential global best list will include the reduced resolution location of each particle in the set for which the fitness has not been calculated and the reduced resolution location of the current global best (i.e., either the reduced resolution location of the global best at iteration k−1 or the reduced resolution location of one of the particles of the swarm at iteration k for which the fitness has been calculated). The flow continues at decision diamond 312.

At decision diamond 312, the i value is compared to set_size (i.e., the number of particles in the set). If the i value is equal to set_size, then the operations of FIG. 3 have been performed on all particles in the set. In other words, the potential personal best list for each particle in the set has been updated at iteration k and the potential global best list for the set includes all potential global bests for the set at iteration k. If the i value equals set_size, the flow continues at block 402 of FIG. 4. If the i value is not equal to set_size, the flow continues at block 322.

At block 322, the i value is incremented. The i value is incremented so that the next particle in the set can be selected and the operations of FIG. 3 repeat at block 304 where particle i is selected.

As previously discussed at decision diamond 306, if the fitness of the reduced resolution location of particle i at iteration k has been calculated, the flow continues at decision diamond 314. At decision diamond 314, it is determined whether the fitness of the reduced resolution location of particle i at iteration k is greater than the fitness of the current personal best for particle i (i.e., the personal best for particle i at iteration k−1). The personal best for particle i at iteration k−1 is the reduced resolution location that particle i has occupied in any iteration prior to iteration k with the greatest fitness.

There are two possible outcomes from the determination made at decision diamond 314. The first possible outcome is that the fitness of the reduced resolution location of particle i at iteration k is not greater than the fitness of the personal best for particle i at iteration k−1. If the fitness of the reduced resolution location of particle i at iteration k is not greater than the fitness of the personal best for particle i at iteration k−1, the flow continues at decision diamond 312 to determine whether all particles in the set have been considered. If the fitness of the reduced resolution location of particle i at iteration k is not greater than the fitness of the personal best for particle i at iteration k−1, the reduced resolution location of particle i at iteration k cannot be a global best for the set. Because the reduced resolution location of particle i at iteration k cannot be a global best for the set, it is not necessary to perform the operations of decision diamond 318 and block 320. If the fitness of the reduced resolution location of particle i at iteration k is not greater than the fitness of the personal best for particle i at iteration k−1, the personal best for particle i at iteration k−1 is the personal best for particle i at iteration k. Put simply, the personal best for particle i at iteration k−1 remains the personal best for particle i at iteration k. Consequently, the potential personal best list for particle i will include only one potential personal best (i.e., the personal best for particle i at iteration k−1).

The second possible outcome is that the fitness of the reduced resolution location of particle i at iteration k is greater than the fitness of the personal best for particle i at iteration k−1. If the fitness of the reduced resolution location of particle i at iteration k is greater than the fitness of the personal best for particle i at iteration k−1, the flow continues at block 316.

At block 316, the potential personal best list for particle i is updated to replace the personal best for particle i at iteration k−1 with the reduced resolution location of particle i at iteration k. Because the fitness of the reduced resolution location of particle i at iteration k is greater than the fitness of the personal best for particle i at iteration k−1, the reduced resolution location of particle i at iteration k is the most fit location that particle i has occupied and is the personal best for particle i at iteration k. After the operations at block 316 have been completed for particle i, the potential personal best list for particle i will include only one potential personal best (i.e., the reduced resolution location of particle i at iteration k) because the personal best for particle i at iteration k is the reduced resolution location of particle i at iteration k. In some embodiments, a fitness value associated with the reduced resolution location of particle i at iteration k is also indicated in the potential personal best list. The flow continues at decision diamond 318.

At decision diamond 318, it is determined whether the fitness of the reduced resolution location particle i at iteration k is greater than the fitness of the current global best for the set (i.e., the global best for the set at iteration k−1). If the fitness of the reduced resolution location of particle i at iteration k is not greater than the fitness of the global best for the set at iteration k−1, the flow continues at decision diamond 312 where the i value is compared to set_size. If the fitness of the reduced resolution location of particle i at iteration k is greater than the fitness of the global best for the set at iteration k−1, the flow continues at block 320.

At block 320, the potential global best list is updated to replace the global best for the set at iteration k−1 with the reduced resolution location of particle i at iteration k. Because the fitness of the reduced resolution location of particle i at iteration k is greater than the fitness of the global best for the set at iteration k−1, the reduced resolution location of particle i at iteration k is the most fit location that any particle in the set has occupied and is now the current global best for the set. As previously discussed at block 310, the potential global best list will include the new current global best (i.e., the reduced resolution location of particle i at iteration k) and the reduced resolution locations of all particles at iteration k for which the fitness is still unknown. In some embodiments, the fitness value associated with the reduced resolution location of particle i at iteration k is also indicated in the potential global best list. The flow continues at decision diamond 312.

At decision diamond 312, if the i value is not equal to set_size, the flow continues at block 322 where the i value is incremented. If the i value is equal to set_size, the operations of FIG. 3 have been completed for all particles in the set and the flow continues at block 402 of FIG. 4.

FIG. 4 is a flow diagram depicting example operations for using the lists updated in FIG. 3 to calculate potential reduced resolution locations for the particles of the set at iteration k+1. The operations of FIG. 4 perform operations for all particles in the set and, using the list updated in FIG. 3, calculate potential reduced resolution locations for the particles in the set at iteration k+1. If there exists only one potential reduced resolution location for a particle at iteration k+1, the reduced resolution location of the particle at iteration k+1 is submitted for fitness calculation. If there exist more than one potential reduced resolution location for the particle at iteration k+1, the more than one potential reduced resolution locations for the particle at iteration k+1 are not submitted for fitness calculation and the operations of FIG. 4 are performed on the next particle in the set. In some embodiments, the operations of FIG. 4 may not begin unless there are fewer than a threshold number of potential global bests. For example, FIG. 4 can include a conditional that checks the number of potential global bests in the potential global best list before selecting a particle from the set for iteration k+1 location calculation. If the number of potential global bests in the potential global best list exceeds a threshold, the operations of FIG. 4 can be suspended until the first thread has evaluated enough particles at iteration k for the potential global best list to include fewer than the threshold number of potential global bests. The operations of FIG. 4 begin at block 402.

At block 402, the i value is reinitialized to a value of one. The i value is reinitialized to a value of one because the operations of FIG. 4 are repeated for each particle in the set. The operations of FIG. 4 perform operations for the particles in the set to determine a number of potential reduced resolution locations that exist for each particle in the set at iteration k+1. The flow continues at block 404.

At block 404, particle i is selected from the set for iteration k+1 location calculation. The flow continues at block 406.

At block 406, a value ("$x_{k+1}$") representing potential reduced resolution locations for particle i at iteration k+1 is initialized to a null value. The $x_{k+1}$ value is initialized to null because no potential reduced resolution locations for particle i at iteration k+1 have been computed. When a reduced resolution location for particle i at iteration k+1 is computed, the $x_{k+1}$ value is updated based on the reduced resolution location of particle i at iteration k+1 that was computed (i.e., $x_{k+1}$ is set to the reduced resolution location of particle i at iteration k+1). The flow continues at block 408.

At block 408, operations begin in which each potential global best in the potential global best list is used to compute reduced resolution locations for particle i at iteration k+1. The flow continues at block 410.

At block 410, operations begin in which each potential personal best in the potential personal best list for particle i is used to compute reduced resolution locations for particle i at iteration k+1. Block 410 in conjunction with block 408 uses all potential personal bests for particle i and all potential global bests for the set to compute all possible reduced resolution location for particle i at iteration k+1. For example, if the potential global best list includes three potential global bests (i.e., $G_1$, $G_2$, and $G_3$) and the potential personal best list for particle i includes two potential personal bests for particle i (i.e., $P_1$ and $P_2$), there are six combinations of global bests and personal bests that can be used to compute potential reduced resolution locations for particle i at iteration k+1. The six possible combinations are 1) $G_1$ and $P_1$, 2) $G_1$ and $P_2$, 3) $G_2$ and $P_1$, 4) $G_2$ and $P_2$, 5) $G_3$ and $P_1$, and 6) $G_3$ and $P_2$. In other words, for the first potential global best (i.e., $G_1$), potential reduced resolution locations for particle i at iteration k+1 are computed using each of the first potential personal best (i.e., $P_1$) and the second potential personal best (i.e., $P_2$). For the second potential global best (i.e., $G_2$), potential reduced resolution locations for particle i at iteration k+1 are computed using each of the first potential personal best (i.e., $P_1$) and the second potential personal best (i.e., $P_2$). For the third potential global best (i.e., $G_3$), potential reduced resolution locations for particle i at iteration k+1 are computed using the first potential personal best (i.e., $P_1$) and the second potential personal best (i.e., $P_2$). The flow continues at block 412.

At block 412, potential reduced resolution locations for particle i at iteration k+1 ("$y_{k+1}$") are computed. In the example discussed above, during each permutation of the operations initiated at block 408 and 410, a different one of the six combinations of potential global bests and personal bests are used to compute a potential reduced resolution location for particle i at iteration k+1. The flow continues at decision diamond 414.

At decision diamond 414, it is determined whether the $x_{k+1}$ value is null. If the $x_{k+1}$ value is null, it is the first permutation of the operations initiated at blocks 408 and 410 and the $y_{k+1}$ value computed at block 412 is the first $y_{k+1}$ value computed for particle i. If the $x_{k+1}$ value is null, the flow continues at block 416. At block 416, the reduced resolution location for particle i at iteration k+1 is set to the computed location at block 412 (i.e., the $x_{k+1}$ value is set to the $y_{k+1}$ value) and the flow continues at block 420. At block 420, another permutation of the operations initiated at block 410 begins (assuming there exist potential personal bests that have not been used to calculate a potential reduced resolution location for particle i at iteration k+1). If the $x_{k+1}$ value is not null, the current permutation of the operations initiated at blocks 408 and 410 is not the first permutation of the operations and the flow continues at decision diamond 418.

At decision diamond 418, the $x_{k+1}$ value is compared to the location computed at block 412 (i.e., $x_{k+1}=y_{k+1}$?). If the $x_{k+1}$ value and the $y_{k+1}$ value are the same, the location computed at block 412 in the current permutation of the operations initiated at blocks 408 and 410 is the same as the location computed at block 412 in all previous permutations of the operations initiated at blocks 408 and 410. If the $x_{k+1}$ value is not the same as the $y_{k+1}$ value, the location calculated at block 412 in the current permutation of the operations initiated at blocks 408 and 410 is not the same as the location computed at block 412 for the previous permutation(s) of the operations initiated at blocks 408 and 410. If the $x_{k+1}$ value is not the same as the $y_{k+1}$ value, there exists more than one potential reduced resolution location for particle i at iteration k+1. If the $x_{k+1}$ value is not the same as the $y_{k+1}$ value, the flow continues at decision diamond 426 (i.e., the operations initiated at blocks 408 and 410 are terminated). The operations initiated at blocks 408 and 410 are terminated because there exists more than one potential reduced resolution location for particle i at iteration k+1 (i.e., the reduced resolution of particle i at iteration k+1 is not known). If the $x_{k+1}$ value is the same as the $y_{k+1}$ value, the location computed at block 412 in the current permutation of the operations initiated at blocks 408 and 410 is the same as all locations computed at block 412 in previous permutations of the operations initiated at blocks 408 and 410. Because the $x_{k+1}$ value is the same as the $y_{k+1}$ value, there is currently only one potential reduced resolution location for particle i at iteration k+1. If the $x_{k+1}$ value is the same as the $y_{k+1}$ value, the flow continues at block 420.

At block 420, if there are remaining potential personal bests in the potential personal best list for particle i (i.e., there are potential personal bests remaining in the personal best list for particle i that have not been used to compute a potential reduced resolution location for particle i at iteration k+1 for the current permutation of the operations initiated at block 408), the flow continues at block 410. At block 410, another permutation of the operations initiated at block 410 begins. If there are no remaining potential personal bests in the personal best list for particle i (i.e., all potential personal bests in the potential personal best list for particle i have been used to calculate a potential reduced resolution location for particle i at iteration k+1 for the current permutation of the operations initiated at block 408), the flow continues at block 422.

At block 422, if there are remaining potential global bests in the potential global best list that have not been used to calculate potential reduced resolution locations for particle i at iteration k+1, the flow continues at block 408. At block 408, another permutation of the operations initiated at block 408 begins. If all potential global bests in the potential global best list have been used to calculate reduced resolution locations of particle i at iteration k+1 (i.e., there are no remaining global bests in the potential global best list), the flow continues at block 424.

At block 424, the reduced resolution location of particle i at iteration k+1 ($y_{k+1}$) is submitted for fitness calculation. If the operations initiated at blocks 408 and 410 have successfully completed potential reduced resolution location calculation for all potential personal bests for particle i and all potential global bests without terminating, there exists only one potential reduced resolution location for particle i at iteration k+1. Because there exists only one potential reduced resolution location for particle i at iteration k+1, the reduced resolution location of particle i at iteration k+1 is known. Because the reduced resolution location of particle i at iteration k+1 is known, the reduced resolution location of particle i at iteration k+1 is submitted for fitness calculation. The flow continues at decision diamond 426.

At decision diamond 426, the i value is compared to set_size. If the i value equals set_size, iteration k+1 location calculations have been performed for all particles in the set. If iteration k+1 location calculations have been performed for all particles in the set, the flow ends. If the i value does not equal set_size, iteration k+1 location calculations have not been performed for all particles in the set and the flow continues at block 428.

At block 428, the i value is incremented. The i value is incremented so that the next particle in the set can be selected for iteration k+1 location calculations. The flow continues until iteration k+1 location calculations have been completed for all particles in the set.

The operations depicted in FIGS. 3 and 4 are provided as examples and different embodiments of the inventive subject matter may employ more operations than depicted in FIGS. 3 and 4, fewer operations than depicted in FIGS. 3 and 4, or operations different from those depicted in FIGS. 3 and 4. For example, although the discussion of FIGS. 3 and 4 describe creating and updating lists to indicate potential personal bests for a particle and potential global bests for a set of particles, embodiments are not so limited. Any suitable data structure may be used indicate potential personal bests for a particle and potential global bests for a set of particles. For example, hash tables, arrays, or sets can be used instead of lists to indicate potential personal bests for a particle and potential global bests for a set of particles. Additionally, although FIG. 4 checks a $y_{k+1}$ value against an $x_{k+1}$ value at decision diamond 418 to determine whether more than one potential reduced resolution location for a particle at iteration k+1 exists, this is but one example and many suitable alternatives exist. For example, during each permutation of the operations initiated at blocks 408 and 410, a data structure (e.g., a set, a list, etc.) associated with the particle can be updated to include the $y_{k+1}$ value computed at block 412. After the data structure is updated, a check can be performed to determine whether the data structure includes more than one unique potential reduced resolution location. Alternatively, this check can be performed after all permutations of the operations initiated at block 408 and 410 have completed for the particle. Finally, some embodiments of the inventive subject matter may utilize a more speculative approach than that described in the discussion of FIG. 4 (e.g., see discussion of FIG. 5). For example, although the operations of FIG. 4 will not submit a reduced resolution location of a particle for fitness calculation unless the reduced resolution location of the particle at iteration k+1 is known, some embodiments allow multiple potential reduced resolution locations for a particle at iteration k+1 to be submitted for fitness calculation. In some embodiments, a threshold value can be defined. If a particle has fewer potential reduced resolution locations at iteration k+1 than the threshold, the potential reduced resolution locations are submitted for fitness calculation. For example, if the threshold value is four and a particle has three potential reduced resolution locations at iteration k+1, all three potential reduced resolution locations for the particle at iteration k+1 will be submitted for fitness calculation. Although only one of the three potential reduced resolution locations will be the reduced resolution location of the particle at iteration k+1, this more speculative analysis could yield new personal and/or global bests. In some embodiments, this more speculative analysis can be reserved for times when there exist available computing resources. In such embodiments, this more speculative analysis can potentially provide new personal and/or global bests while efficiently using computing resources.

Figure 5:
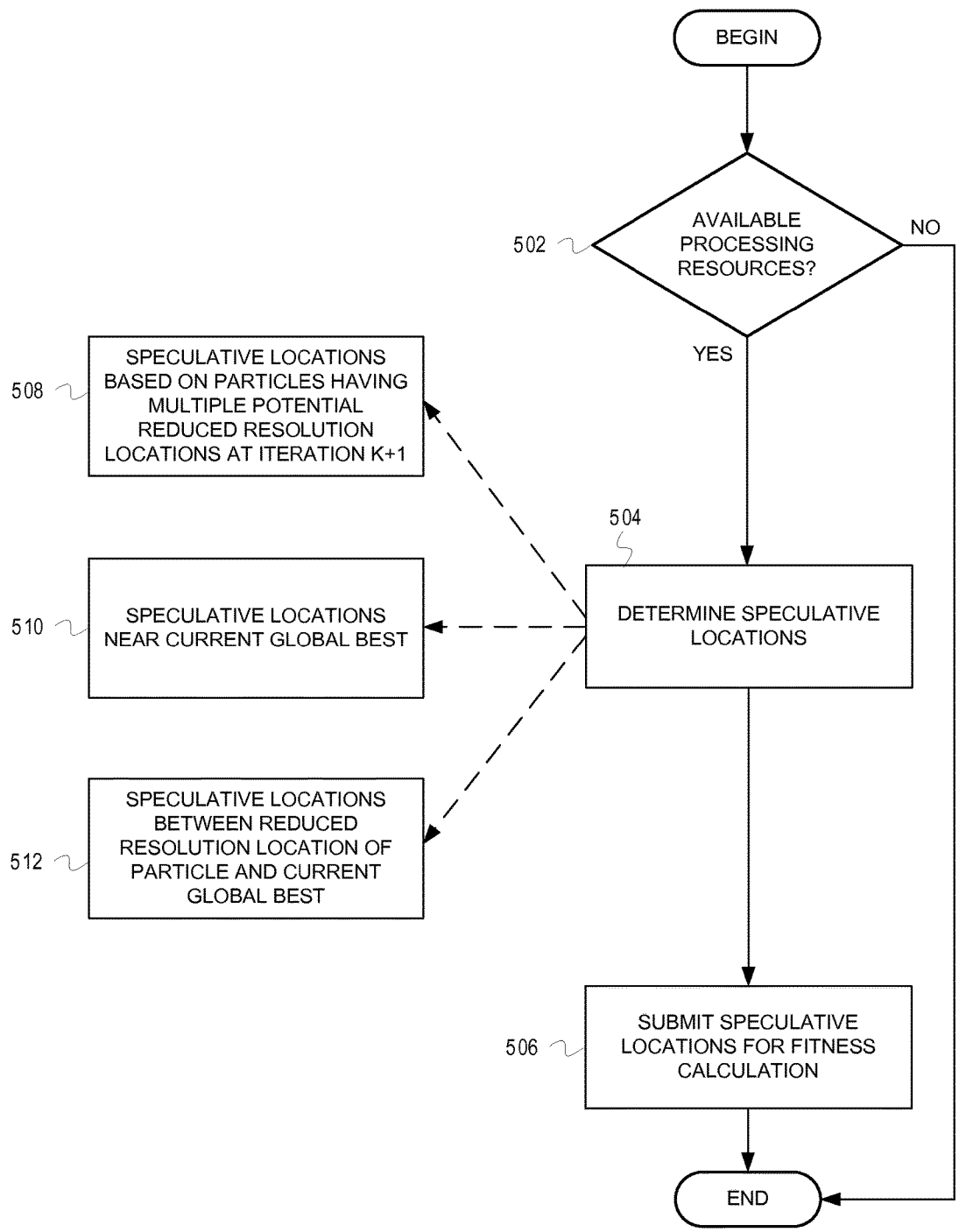
FIG. 5 is a flow diagram depicting example operations for submitting speculative reduced resolution locations for fitness calculation to accelerate a particle swarm optimization based on resource utilization.

FIG. 5 is a flow diagram depicting example operations for submitting speculative locations for fitness calculation to accelerate a particle swarm optimization based on resource utilization. If resources are available, speculative locations can be submitted for fitness calculation. For example, if there are an insufficient number of reduced resolution locations awaiting fitness calculation to efficiently utilize available resources, then speculative locations can be submitted for fitness calculation to use the underutilize resources for the fitness calculation queue. Some embodiments of the inventive subject matter utilize two or more fitness calculation queues. For example, a first fitness calculation queue includes reduced resolution locations for particles at iteration k and a second fitness calculation queue includes reduced resolution locations for particles at iteration k+1. In such embodiments, different processing resources are used to perform fitness calculations for the reduced resolution locations in each fitness calculation queue. For example, a first processor can perform fitness calculations for reduced resolution locations in the first fitness calculation queue and a second processor can perform fitness calculations for reduced resolution locations in the second fitness calculation queue. In such embodiments, speculative locations are added to the second fitness calculation queue. Utilization of separate fitness calculation queues can ensure that acceleration operations in iteration k+1 do not interfere with the operations in iteration k.

The operations of FIG. 5 provide example operations for submitting speculative locations for fitness calculation. In some embodiments, the operations of FIG. 5 begin after the operations of FIGS. 3 and 4 are complete for a given iteration. After the operations of FIGS. 3 and 4, all known particle locations (i.e., reduced resolution locations) at iteration k+1 have been submitted for fitness calculation. Although all known particle locations at iteration k+1 have been submitted for fitness calculation, there may still be available processing resources. To ensure efficient use of resources, speculative locations can be submitted for fitness calculation. In some embodiments, the speculative locations have the same degree of precision as the reduced resolution locations. The flow begins at decision diamond 502.

At decision diamond 502, it is determined whether there are available processing resources. For example, the number of reduced resolution locations awaiting fitness calculation (i.e., the number of reduced resolution locations in a fitness queue) can be used as a proxy for resource utilization. In such embodiments, if the number of reduced resolution locations awaiting fitness calculation is below a threshold, it is assumed that there exist available resources. This threshold can be a static value. For example, the threshold can be set so that when there are fewer than five reduced resolution locations awaiting fitness calculation, speculative locations will be submitted for fitness calculation. Alternatively, this threshold can vary dependent upon progress of the particle swarm optimization. For example, if the fitness of fewer than 33% of the reduced resolution locations of particles in a set at iteration k has been calculated, the threshold is 10. If the fitness of fewer than 66% but greater than 33% of the reduced resolution locations of particles in the set at iteration k has been calculated, the threshold is five. And if the fitness of more than 66% of the reduced resolution locations of particles in the set at iteration k has been calculated, the threshold is two. If there are no available resources, the flow ends. If there are available resources, the flow continues at block 504.

At block 504, speculative locations are determined. Speculative locations can be determined using a variety of determination techniques. Each of blocks 508, 510, and 512 describe an example determination technique. In some embodiments, the determination technique that is used is dependent on a level of resource utilization. For example, if the level of available processing resource is low, minimally speculative determination techniques can be used (e.g., the determination technique of block 508). If the level of available processing resource is high, more speculative determination techniques can be used (e.g., random locations within a solution space can be chosen as speculative locations). Each of the example determination techniques described in blocks 508, 510, and 512 will be discussed below. Although three example determination techniques are provided in FIG. 5, other determination techniques may be used and the determination techniques of FIG. 5 are not limited to these three example determination techniques. For example, random locations can be chosen as speculative locations or locations near any of the particles' personal bests can be chosen as speculative locations. After the speculative locations are determined, the flow continues at block 506.

A first example determination technique is described at block 508. At block 508, speculative locations are determined from a group of potential reduced resolution locations for a particle at iteration k+1. For example, if a particle has two potential reduced resolution locations at iteration k+1, one or both of the potential reduced resolution locations for the particle at iteration k+1 can be chosen as speculative locations. Although it is not known which of the two potential reduced resolution locations for the particle at iteration k+1 will be the reduced resolution location of the particle at iteration k+1, it can be worthwhile to calculate the fitness of one or both of the potential reduced resolution locations for the particle at iteration k+1 if processing resources are currently available.

A second example determination technique is described at block 510. At block 510, speculative locations can be determined based on a current global best. For example, speculative locations can be chosen from locations adjacent to or near the current global best. As stated, the number of speculative locations adjacent to the global best chosen for fitness calculation can vary with the level of available resources, but can also vary with other factors or may not vary from a predefined number. As an example of other factors that influence selection, the number of locations adjacent to a global best can vary based on the number of iterations passed and/or quality of the current global best. The speculative locations adjacent to the current global best can be chosen randomly or chosen based on personal bests of n most fit particles. Adjacency of locations can be defined as any locations of the reduced resolution within a given distance of the global best. This given distance can vary based on proximity of other particles, variance in previous global bests, etc.

A third example determination technique is described at block 512. At block 512, speculative locations can be determined based on a current global best and a current personal best for one of the particles of the set. For example, speculative locations can be chosen from locations residing on a line between the current global best and the current personal best for the one of the particles.

As previously discussed, after the speculative locations are determined at block 504, the flow continues at block 506. At block 506, the speculative locations are submitted for fitness calculation. For example, the speculative locations can be added to a fitness calculation queue. As previously discussed, in some embodiments, there exists more than one fitness calculation queue. In such embodiments, the speculative locations can be added to a fitness calculation queue including reduced resolution locations for particles at iteration k+1. Alternatively, speculative locations can be added to their own fitness calculation queue. For example, some embodiments include a fitness calculation queue that includes only speculative locations.

Although FIG. 5 describes using a number of reduced resolution locations awaiting fitness calculation as a metric for resource utilization, another metric for resource utilization can be used. For example, processor usage can be monitored. If processor usage falls below a specified level, the operations of FIG. 5 are initiated and speculative reduced resolution locations are submitted for fitness calculation. Additionally, although the discussion of FIG. 5 describes the operations of FIG. 5 working in concert with the operations of FIGS. 3 and 4, in some embodiments, the operations of FIG. 5 work independently, or irrespective, of the operations of FIGS. 3 and 4. For example, instead of waiting for the operations of FIGS. 3 and 4 to complete, the operations of FIG. 5 can be triggered at random or predetermined intervals. In such embodiments, resource utilization is checked periodically. If during a periodic check it is determined that there are available resources, speculative reduced resolution locations are determined and submitted for fitness calculation. As another example, resource utilization can be monitored continuously. In such embodiments, whenever there are available resources, speculative reduced resolution locations are determined and submitted for fitness calculation.

As will be appreciated by one skilled in the art, aspects of the inventive subject matter may be embodied as a system, method or computer program product. Accordingly, aspects of the inventive subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the inventive subject matter may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the inventive subject matter may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the inventive subject matter are described with reference to flowchart illustrations and/or block diagrams of methods, apparatus (systems) and computer program products according to embodiments of the inventive subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 6:
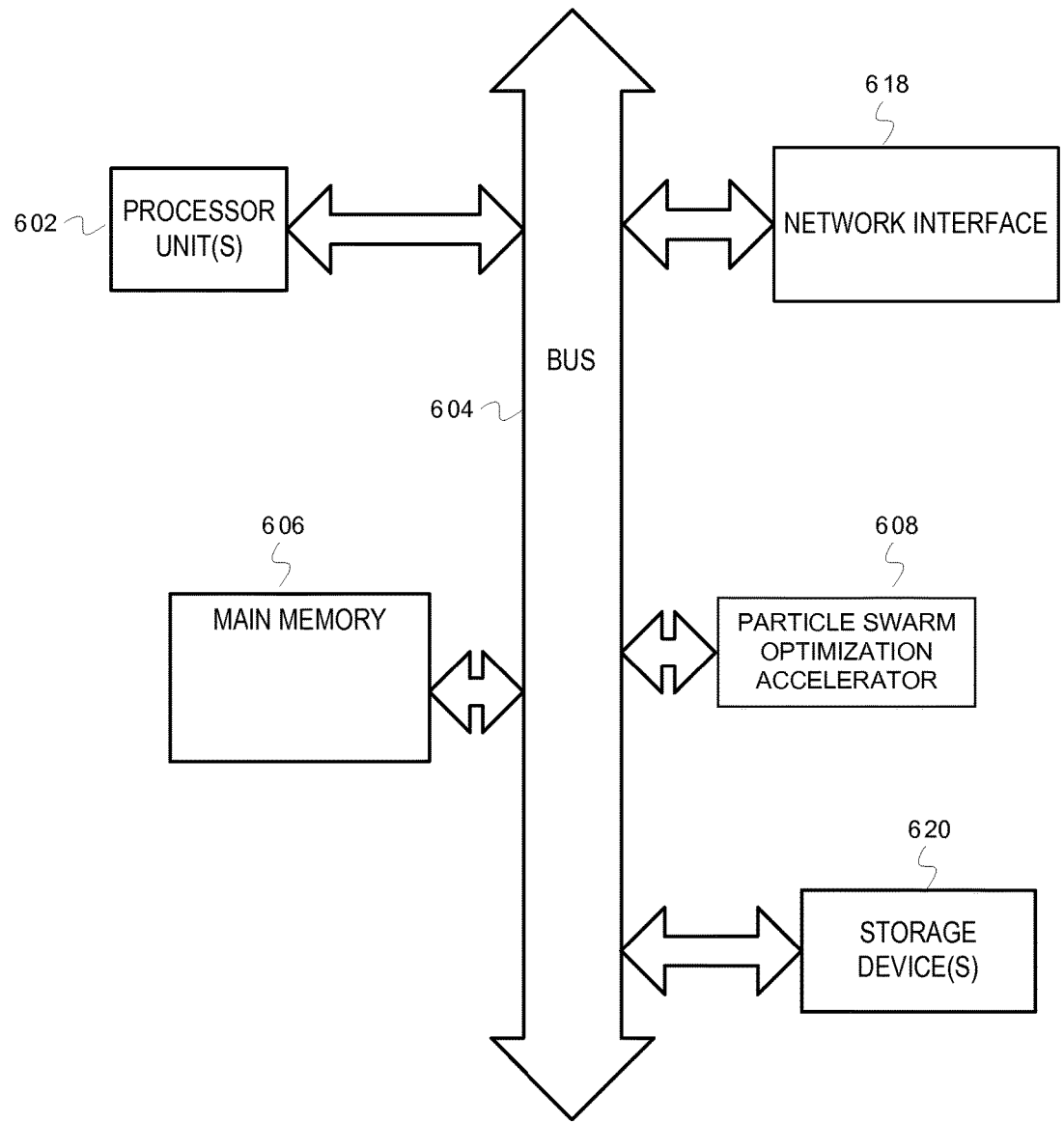
FIG. 6 depicts an example computer system with a particle swarm optimization accelerator.

FIG. 6 depicts an example computer system with a particle swarm optimization accelerator. A computer system includes a processor unit 602 (possibly including multiple processors, multiple cores, multiple nodes, and/or implementing multi-threading, etc.). The computer system includes memory 606. The memory 606 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer system also includes a bus 604 (e.g., PCI, ISA, PCI-Express, HyperTransport® bus, InfiniBand® bus, NuBus bus, etc.), a network interface 618 (e.g., an ATM interface, an Ethernet interface, a Frame Relay interface, SONET interface, wireless interface, etc.), and a storage device(s) 620 (e.g., optical storage, magnetic storage, etc.). The computer system also includes a particle swarm optimization accelerator ("accelerator") 608. This accelerator 608 uses reduced resolution of locations to accelerate the particle swarm optimization into a next iteration as described above. Any one of the functionalities may be partially (or entirely) implemented in hardware and/or on the processing unit 602. For example, the functionality may be implemented with an application specific integrated circuit, in logic implemented in the processing unit 602, in a co-processor on a peripheral device or card, etc. Further, realizations may include fewer or additional components not illustrated in FIG. 6 (e.g., video cards, audio cards, additional network interfaces, peripheral devices, etc.). The processor unit 602, the storage device(s) 620, and the network interface 618 are coupled to the bus 604. Although illustrated as being coupled to the bus 604, the memory 606 may be coupled to the processor unit 602.

While the embodiments are described with reference to various implementations and exploitations, it will be understood that these embodiments are illustrative and that the scope of the inventive subject matter is not limited to them. In general, techniques for accelerating a particle swarm optimization as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the example configurations may be implemented as a combined structure or component. Similarly, structures and functionality presented as a single component may be implemented as separate components. These and other variations, modifications, additions, and improvements may fall within the scope of the inventive subject matter.

Use of the phrase "at least one of . . . or" should not be construed to be exclusive. For instance, the phrase "X comprises at least one of A, B, or C" does not mean that X comprises only one of {A, B, C}; it does not mean that X comprises only one instance of each of {A, B, C}, even if any one of {A, B, C} is a category or sub-category; and it does not mean that an additional element cannot be added to the non-exclusive set (i.e., X can comprise {A, B, Z}).

What is claimed is:

1. A computer implemented method for accelerating a particle swarm optimization, the method comprising:
   determining, by one or more processors, a plurality of potential full resolution locations for a particle representation for a second iteration of a particle swarm optimization, wherein the particle representation is associated with both a first full resolution location and a first reduced resolution location for a first iteration of the particle swarm optimization that has not yet completed and the second iteration is later than the first iteration;
   determining, by the one or more processors, that the plurality of potential full resolution locations reduces to a second reduced resolution location for the second iteration; and
   submitting, by the one or more processors, the second reduced resolution location for fitness calculation prior to the first iteration completing.

2. The method of claim 1, wherein determining the plurality of potential full resolution locations comprises determining the plurality of potential full resolution locations based, at least in part, on a set of one or more personal bests for the particle representation for the first iteration and a plurality of potential global bests for the first iteration.

3. The method of claim 2, wherein the plurality of potential global bests is based, at least in part, on a global best for a third iteration that precedes the first iteration and reduced resolution locations for the first iteration for a plurality of particle representations for which fitness has yet to be determined.

4. The method of claim 1, further comprising:
   determining a second plurality of potential full resolution locations for the second iteration for a second particle representation;
   determining that the second plurality of potential full resolution locations does not reduce to a single reduced resolution location for the second particle representation for the second iteration; and
   waiting for fitness to be computed for at least one additional particle representation for the first iteration before attempting to accelerate again.

5. The method of claim 1 further comprising:
   determining that fitness of the first reduced resolution location has been computed prior to determining the plurality of potential full resolution locations.

6. The method of claim 1, wherein determining that the plurality of potential full resolution locations reduces to the second reduced resolution location comprises at least one of rounding, truncating, eliminating insignificant figures, and reducing mathematical precision of the plurality of potential full resolution locations.

7. The method of claim 1 further comprising determining a reduction in full resolution to reduced resolution based, at least in part, on resolution of parameters for a problem, wherein the plurality of potential full resolution locations represent candidate solutions to the problem.

8. The method of claim 1 further comprising:
   determining that processing resources are available;
   determining speculative reduced resolution locations; and
   submitting the speculative reduced resolution locations for fitness calculation.

9. The method of claim 8, wherein determining that processing resources are available comprises determining that a number of reduced resolution locations submitted for fitness calculation for the second iteration is below a threshold.

\* \* \* \* \*